US010290583B2

(12) United States Patent
Miura

(10) Patent No.: US 10,290,583 B2
(45) Date of Patent: May 14, 2019

(54) SEMICONDUCTOR DEVICE

(71) Applicant: RENESAS ELECTRONICS CORPORATION, Tokyo (JP)

(72) Inventor: Yoshinao Miura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 17 days.

(21) Appl. No.: 15/467,051

(22) Filed: Mar. 23, 2017

(65) Prior Publication Data

US 2017/0278798 A1 Sep. 28, 2017

(30) Foreign Application Priority Data

Mar. 24, 2016 (JP) ................. 2016-059545

(51) Int. Cl.
*H01L 23/535* (2006.01)
*H01L 27/088* (2006.01)
*H01L 29/06* (2006.01)
*H01L 29/417* (2006.01)
*H01L 29/423* (2006.01)
*H01L 23/528* (2006.01)

(52) U.S. Cl.
CPC .......... *H01L 23/535* (2013.01); *H01L 27/088* (2013.01); *H01L 29/0653* (2013.01); *H01L 29/41775* (2013.01); *H01L 29/42356* (2013.01); *H01L 23/528* (2013.01)

(58) Field of Classification Search
CPC . H01L 23/535; H01L 23/501; H01L 23/4824; H01L 23/485; H01L 23/5283; H01L 23/528; H01L 29/41775; H01L 29/41758; H01L 29/42356; H01L 27/088; H01L 27/0203; H01L 27/0207
See application file for complete search history.

(56) References Cited

U.S. PATENT DOCUMENTS 9,054,073 B2 6/2015 Matsumoto et al.
2015/0035080 A1* 2/2015 Matsumoto ........... H01L 27/088
257/390

FOREIGN PATENT DOCUMENTS

JP 2015-032600 A 2/2015

* cited by examiner

*Primary Examiner* — David C Spalla
(74) *Attorney, Agent, or Firm* — McDermott Will & Emery LLP

(57) ABSTRACT

An object of the present invention is to shorten the switching delay time of a semiconductor device.
Transistor units are provided between a source bus line and a drain bus line that are provided apart from each other in a first direction, and a plurality of gate electrodes that extends in the first direction and is provided apart from each other in a second direction orthogonal to the first direction is provided in the transistor units. One ends of the gate electrodes on the source bus line side are coupled by a gate connection line extending in the second direction, and a gate bus line electrically coupled to the gate connection line is provided above the gate connection line. The gate electrodes and the gate connection line are formed using a wiring layer of the first layer, the source bus line and the drain bus line are formed using a wiring layer of the second layer, and the gate bus line is formed using a wiring layer of the third layer.

15 Claims, 11 Drawing Sheets

SEMICONDUCTOR DEVICE

CROSS-REFERENCE TO RELATED APPLICATIONS

The disclosure of Japanese Patent Application No. 2016-059545 filed on Mar. 24, 2016 including the specification, drawings and abstract is incorporated herein by reference in its entirety.

BACKGROUND

The present invention relates to a semiconductor device, and can be preferably used for, for example, a semiconductor device including a power transistor.

Japanese Unexamined Patent Application Publication No. 2015-32600 describes a semiconductor device in which a plurality of transistor units each having a plurality of transistors is arranged while being aligned in a first direction. A gate electrode of each of the transistors is coupled to a gate bus line extending in the longitudinal direction of the transistor units, and further the gate bus line is drawn from an end of the transistor units to be coupled to a gate plate.

SUMMARY

As one of characteristics of a power transistor using GaN (gallium nitride), the switching speed is fast. However, when the area of a semiconductor chip is enlarged to increase the current capacity, the length of the gate bus line is increased, and the switching delay time becomes disadvantageously long. Further, when the width of the gate bus line is widened to reduce the resistance thereof, the area of the semiconductor chip is disadvantageously enlarged.

The other objects and novel features will become apparent from the description of the specification and the accompanying drawings.

In a semiconductor device according to an embodiment, transistor units are provided between a source bus line and a drain bus line that are provided apart from each other in a first direction, and a plurality of gate electrodes that extends in the first direction and is provided apart from each other in a second direction orthogonal to the first direction is provided in the transistor units. One ends of the gate electrodes on the source bus line side are coupled by a gate connection line extending in the second direction, and a gate bus line electrically coupled to the gate connection line is provided above the gate connection line. In addition, the gate electrodes and the gate connection line are formed using a wiring layer of the first layer, the source bus line and the drain bus line are formed using a wiring layer of the second layer, and the gate bus line is formed using a wiring layer of the third layer.

According to an embodiment, the switching delay time of a semiconductor device can be shortened.

DETAILED DESCRIPTION

Figure 1:
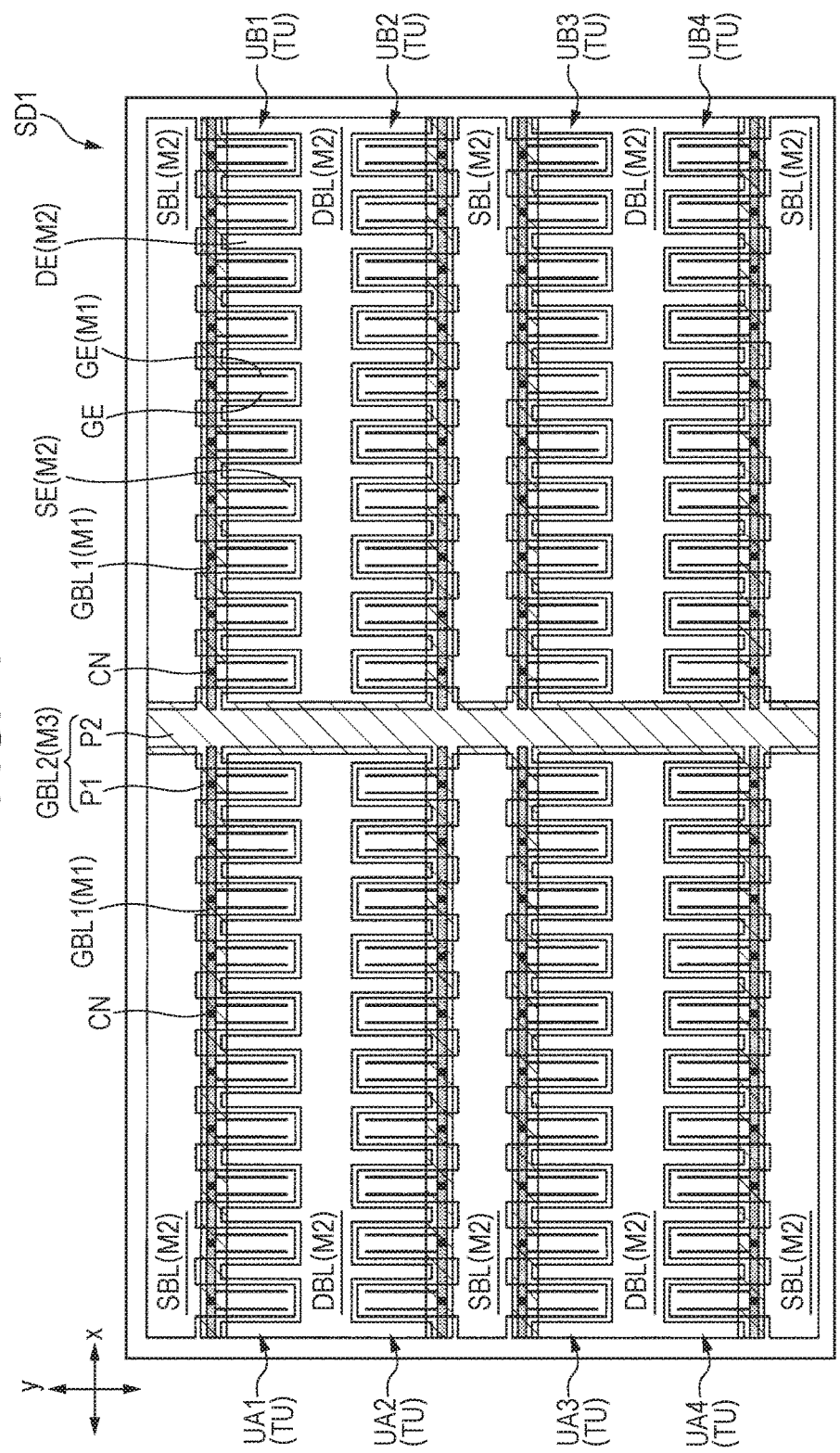
FIG. 1 is a plan view for showing a first configuration example of a semiconductor device according to an embodiment.

The present invention will be described in the following embodiment while being divided into a plurality of sections or embodiments if necessary for convenience sake. However, except for a case especially specified, the sections or embodiments are not irrelevant to each other, and one has a relationship as a part of a modified example or a complete modified example, or a detailed or supplementary explanation of the other.

Further, if the specification refers to the number of elements (including the number of pieces, values, amounts, ranges, and the like) in the following embodiment, the present invention is not limited to the specific number, but may be smaller or larger than the specific number, except for a case especially specified or a case obviously limited to the specific number in principle.

Further, it is obvious that the components (including elemental steps and the like) are not necessarily essential in the following embodiment, except for a case especially specified or a case obviously deemed to be essential in principle.

Further, it is obvious that "composed of A", "consisting of A", "having A", and "including A" in the following description do not exclude the other components except for a case in which only the "A" is specified. Likewise, if the specification refers to the shapes or positional relationships of components in the following embodiment, the present invention includes those that are substantially close or similar to components in shapes and the like, except for a case especially specified or a case obviously deemed not to be close or similar in principle. The same applies to the values and ranges.

Further, in the drawings used in the following embodiment, hatchings will be illustrated in some cases even in the case of plan views in order to easily view the drawings. Further, in cross-sectional views and plan views, the size of each region does not correspond to an actual device, but a specific region will be occasionally illustrated in a relatively large size in order to easily understand the drawings. Further, even in the case where cross-sectional views are associated with plan views, a specific region will be occasionally illustrated in a relatively large size in order to easily understand the drawings. Further, in all the drawings for describing the following embodiment, the components having the same functions will be followed by the same signs in principle, and the explanation thereof will be omitted.

Hereinafter, an embodiment will be described in detail on the basis of the drawings.

Embodiment

<Configuration of Semiconductor Device>

A first configuration example and a second configuration example of a semiconductor device according an embodiment will be described using FIG. 1 and FIG. 2.

First Configuration Example

FIG. 1 is a plan view or showing the first configuration example of the semiconductor device according to the embodiment.

A semiconductor device SD1 has, for example, a rectangular shape, and includes a plurality of transistor units TU. In the first configuration example, four transistor units UA1, UA2, UA3, and UA4 are arranged while being aligned along a first direction (y-direction). Likewise, four transistor units UB1, UB2, UB3, and UB4 are arranged while being aligned along the first direction. In addition, a first group composed of the four transistor units UA1, UA2, UA3, and UA4 and a second group composed of the four transistor units UB1, UB2, UB3, and UB4 are arranged while being aligned along a second direction (x-direction) orthogonal to the first direction. Thus, the semiconductor device SD1 is configured using the eight transistor units TU.

For example, a plurality of power transistors for electric power control is formed in the transistor units TU, and has a source electrode SE and a drain electrode DE that are arranged apart from each other in the second direction in planar view, and a gate electrode GE that controls on/off of a current flowing between the source electrode SE and the drain electrode DE. The source electrode SE, the drain electrode DE, and the gate electrode GE extend in the first direction.

Source bus lines SBL and drain bus lines DBL are arranged so as to sandwich the transistor units TU in the first direction. Further, the source bus lines SBL and the drain bus lines DBL are alternately arranged in the first direction. The source bus lines SBL and the drain bus lines DBL extend in the second direction.

The source bus lines SBL are coupled to one ends of the source electrodes SE provided in the power transistors configuring the transistor units TU, and the source electrodes SE extending in the first direction are bundled by the source bus lines SBL extending in the second direction. The source bus line SBL and the source electrodes SE are formed integrally with a conductive film of the same layer.

The drain bus lines DBL are coupled to one ends of the drain electrodes DE provided in the power transistors configuring the transistor units TU, and the drain electrodes DE extending in the first direction are bundled by the drain bus lines DBL extending in the second direction. The drain bus line DBL and the drain electrodes DE are formed integrally with a conductive film of the same layer.

Further, gate connection lines GBL1 extending in the second direction and gate bus lines GBL2 each of which is formed above the gate connection line GBL1 through an interlayer insulating film are provided in the transistor units TU.

The gate connection lines GBL1 are coupled to ends of the gate electrodes GE, on the source bus line SBL side, provided in the power transistors configuring the transistor units TU, and the gate electrodes GE extending in the first direction are bundled by the gate connection lines GBL1 extending in the second direction. The gate connection line GBL1 and the gate electrodes GE are formed integrally with a conductive film of the same layer.

Each of the gate bus lines GBL2 is configured using a first part P1 and a second part P2. The first part P1 is formed right above the gate connection line GBL1 through an interlayer insulating film, and extends in the second direction in the transistor units TU. The second part P2 is located between the first group composed of the transistor units UA1, UA2, UA3, and UA4 and the second group composed of the transistor units UB1, UB2, UB3, and UB4 arranged while being aligned along the second direction, and extends in the first direction.

The first parts P1 of the gate bus line GBL2 extending in the second direction are bundled by the second part P2 of the gate bus line GBL2 extending in the first direction. The gate bus line GBL2 is electrically coupled to the gate connection line GBL1 through a plurality of connection holes CN formed in an interlayer insulating film between the gate connection line GBL1 and the first part P1 of the gate bus line GBL2.

Figure 4:
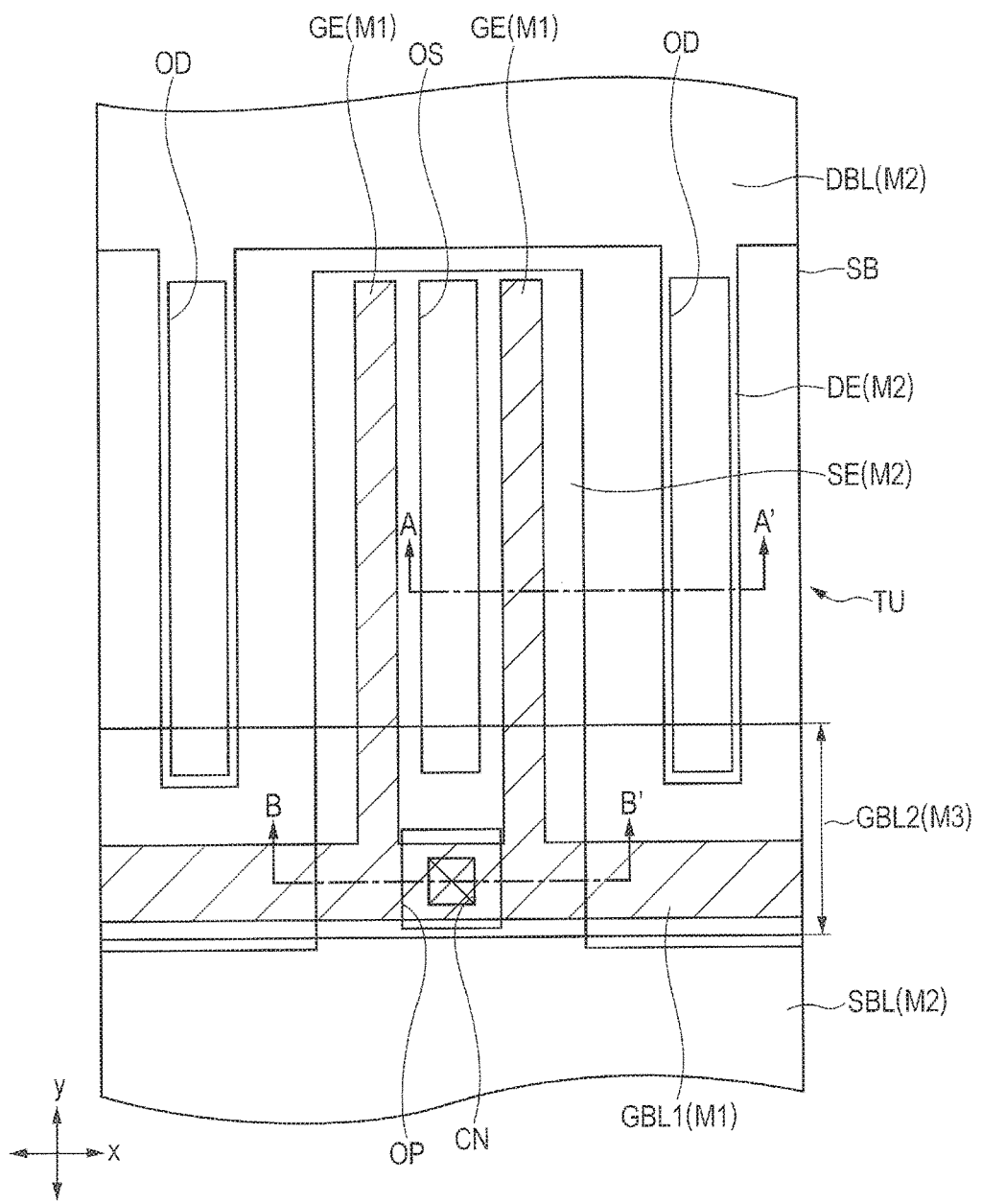
FIG. 4 is a plan view for showing a configuration of each power transistor provided in transistor units according to the embodiment.

Although not shown in the drawing, the connection holes CN coupling the gate connection line GN1 and the gate bus line GBL2 to each other are formed inside openings formed in the respective source electrodes SE (for example, see FIG. 4). The connection holes CN are formed to avoid contacting with the source electrodes SE because the gate connection line GBL1 is arranged so as to be partially overlapped with the source electrodes SE in planar view.

The gate connection line GBL1 (including the gate electrodes GE) is formed by a wiring layer M1 of the first layer. The source bus line SBL (including the source electrodes SE) and the drain bus line DBL (including the drain electrodes DE) are formed by a wiring layer M2 of the second layer. The gate bus line GBL2 is formed by a wiring layer M3 of the third layer. Thus, the gate connection line GBL1 (including the gate electrodes GE), the source bus line SBL (including the source electrodes SE), the drain bus line DBL (including the drain electrodes DE), and the gate bus line GBL2 are formed by electrode layers that are different from each other.

Second Configuration Example

Figure 2:
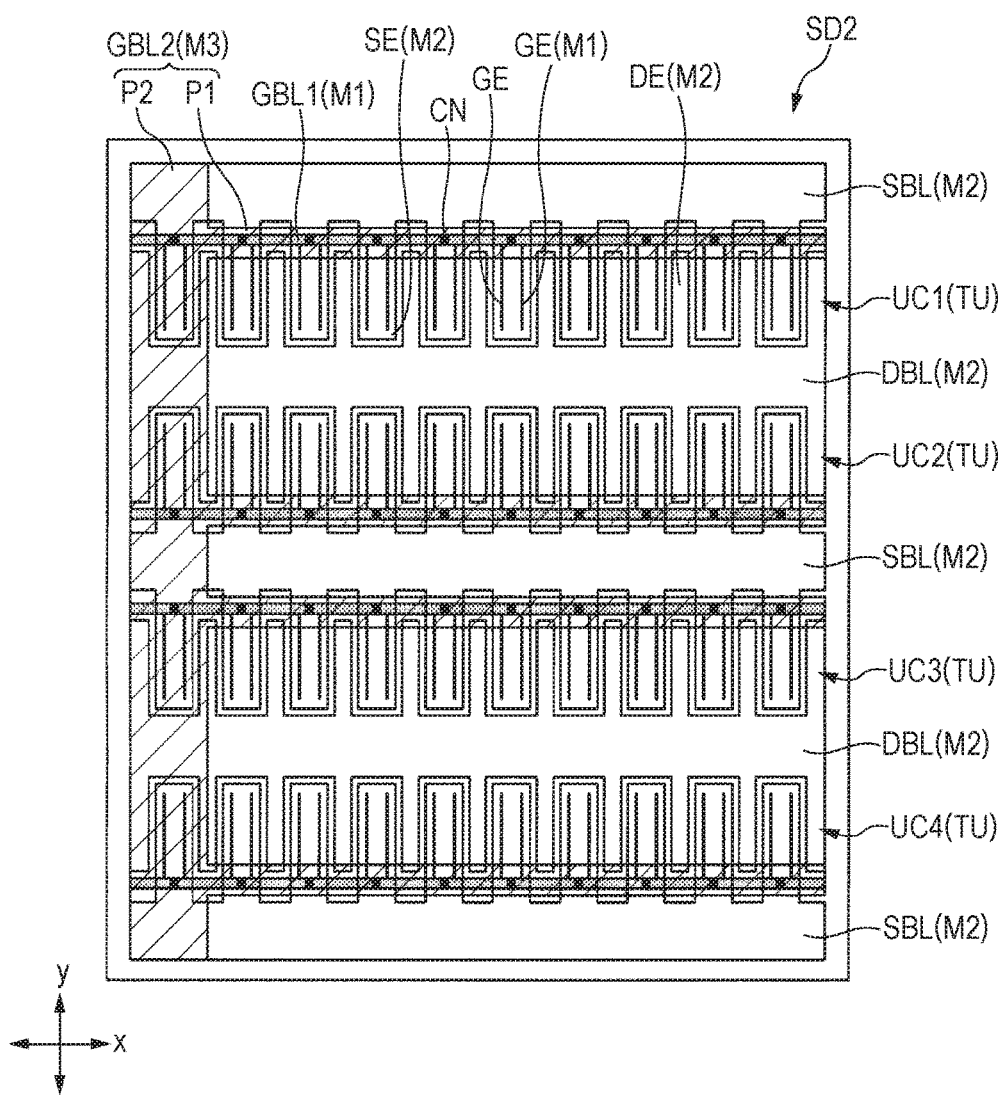
FIG. 2 is a plan view for showing a second configuration example of the semiconductor device according to the embodiment.

FIG. 2 is a plan view for showing the second configuration example of the semiconductor device according to the embodiment.

In the second configuration example, shown is a semiconductor device SD2 having nearly the same configuration as, for example, one of the first group composed of the transistor units UA1, UA2, UA3, and UA4 and the second group composed of the transistor units UB1, UB2, UB3, and UB4 arranged while being aligned along the first direction in the first configuration example.

The semiconductor device SD2 has, for example, a rectangular shape, and includes a plurality of transistor units TU. In the second configuration example, four transistor units UC1, UC2, UC3, and UC4 are arranged while being aligned along a first direction (y-direction).

For example, a plurality of power transistors for electric power control is formed in the transistor units TU, and has a source electrode SE and a drain electrode DE that are arranged apart from each other in a second direction (x-direction) orthogonal to the first direction in planar view, and a gate electrode GE that controls on/off of a current flowing between the source electrode SE and the drain electrode DE. The source electrode SE, the drain electrode DE, and the gate electrode GE extend in the first direction.

Source bus lines SBL and drain bus lines DBL are arranged so as to sandwich the transistor units TU in the first direction. Further, the source bus lines SBL and the drain bus lines DBL are alternately arranged in the first direction. The source bus lines SBL and the drain bus lines DBL extend in the second direction.

The source bus lines SBL are coupled to one ends of the source electrodes SE provided in the power transistors configuring the transistor units TU, and the source electrodes SE extending in the first direction are bundled by the source bus lines SBL extending in the second direction. The source bus line SBL and the source electrodes SE are formed integrally with a conductive film of the same layer.

The drain bus lines DBL are coupled to one ends of the drain electrodes DE provided in the power transistors configuring the transistor units TU, and the drain electrodes DE extending in the first direction are bundled by the drain bus lines DBL extending in the second direction. The drain bus line DEL and the drain electrodes DE are formed integrally with a conductive film of the same layer.

Further, gate connection lines GBL1 extending in the second direction and gate bus lines GBL2 each of which is formed above the gate connection line GBL1 through an interlayer insulating film are provided in the transistor units TU.

The gate connection lines GBL1 are coupled to ends of the gate electrodes GE, on the source bus line SBL side, provided in the power transistors configuring the transistor units TU, and the gate electrodes GE extending in the first direction are bundled by the gate connection lines GBL1 extending in the second direction. The gate connection line GBL1 and the gate electrodes GE are formed integrally with a conductive film of the same layer.

Each of the gate bus lines GBL2 is configured using a first part P1 and a second part P2. The first part P1 is formed right above the gate connection line GBL1 through an interlayer insulating film, and extends in the second direction in the transistor units TU. The second part P2 is formed at one end of the first part P1, and extends in the first direction.

The first parts P1 of the gate bus line GBL2 extending in the second direction are bundled by the second part P2 of the gate bus line GBL2 extending in the first direction. The gate bus line GBL2 is electrically coupled to the gate connection line GBL1 through a plurality of connection holes CN formed in an interlayer insulating film between the gate connection line GBL1 and the first part P1 of the gate bus line GBL2.

Although not shown in the drawing, the connection holes CN coupling the gate connection line GBL1 and the gate bus line GBL2 to each other are formed inside openings formed in the respective source electrodes SE (for example, see FIG. 4). The connection holes CN are formed to avoid contacting with the source electrodes SE because the gate connection line GBL1 is arranged so as to be partially overlapped with the source electrodes SE in planar view.

The gate connection line GBL1 (including the gate electrodes GE) is formed by a wiring layer M1 of the first layer. The source bus line SBL (including the source electrodes SE) and the drain bus line DBL (including the drain electrodes DE) are formed by a wiring layer M2 of the second layer. The gate bus line GBL2 is formed by a wiring layer M3 of the third layer. Thus, the gate connection line GBL1 (including the gate electrodes GE), the source bus line SBL (including the source electrodes SE), the drain bus line DBL (including the drain electrodes DE), and the gate bus line GBL2 are formed by the wiring layers that are different from each other.

<Mounted Configuration of Semiconductor Device>

Figure 3:
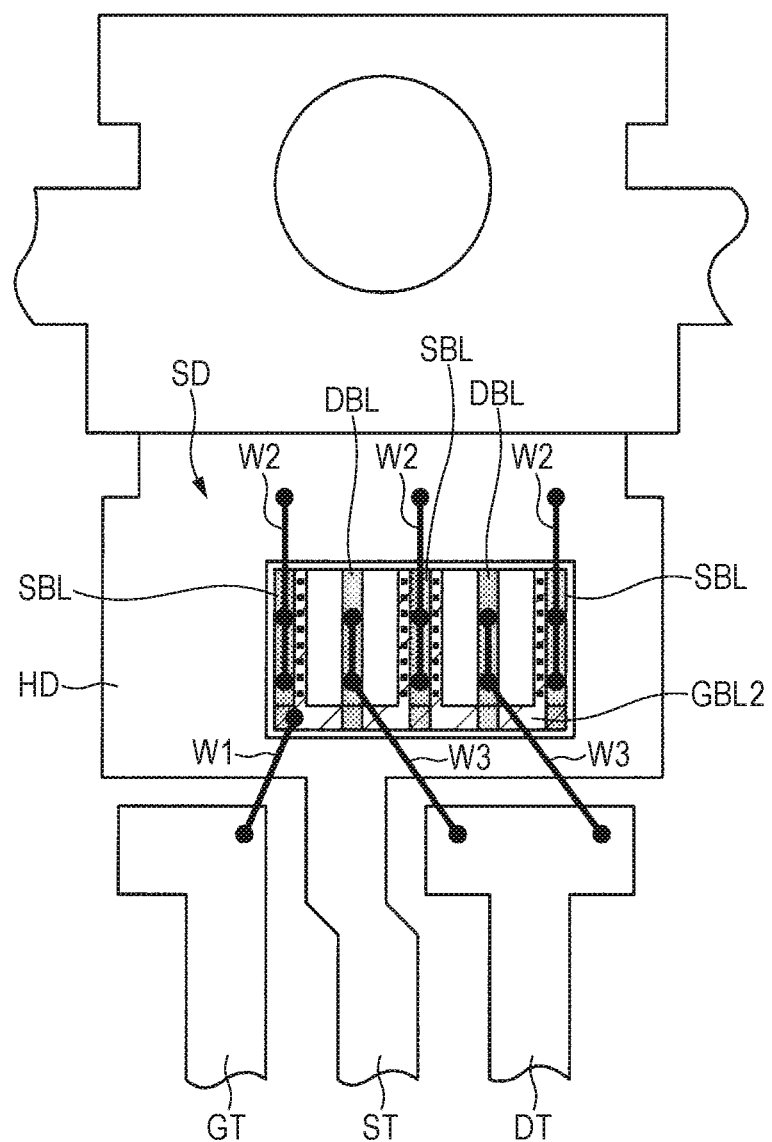
FIG. 3 is a plan view for showing a mounted configuration of the semiconductor device according to the embodiment.

A mounted configuration example of the semiconductor device according to the embodiment will be described using FIG. 3. FIG. 3 is a plan view for showing a mounted configuration of the semiconductor device according to the embodiment.

As shown in FIG. 3, a semiconductor device SD is mounted over a holding member HD. The holding member HD is, for example, a lead frame of a semiconductor package, and has a gate terminal (gate pin) GT, a source terminal (source pin) ST, and a drain terminal (drain pin) DT.

The gate terminal GT is coupled to the gate bus line GBL2 formed in the semiconductor device SD through a wire W1. The source terminal ST is coupled to the source bus lines SBL formed in the semiconductor device SD through wires W2. The drain terminal DT is coupled to the drain bus lines DBL formed in the semiconductor device SD through wires W3.

The wires W1, W2, and W3 are configured using, for example, Au (gold) lines. Further, the wires W2 are joined to the source bus lines SBL at a plurality of points, and the wires W3 are joined to the drain bus lines DBL at a plurality of points. Accordingly, voltages can be supplied to the source bus lines SBL or the drain bus lines DBL from a plurality of points.

In general, the resistance of each of the source bus lines SBL and the drain bus lines DBL is higher than that of each of the wires W2 and W3. However, the ratio of the source bus lines SBL and the drain bus lines DBL to a current path can be reduced by employing the above-described configuration. As a result, the resistance in the current path can be reduced.

<Layout of Gate Bus Line in Semiconductor Device>

A layout of the gate bus line provided in the semiconductor device according to the embodiment will be described using FIG. 4. FIG. 4 is a plan view for showing a configuration of each power transistor provided in the transistor units according to the embodiment.

The semiconductor device is formed using a substrate SB. The transistor unit TU is provided between the source bus line SBL and the drain bus line DBL that are arranged apart from each other in the first direction (y-direction). The source bus line SBL and the drain bus line DBL are separated from each other by, far example, about 2 to 4 mm.

An element formation region is provided in each of the transistor units TU, and the power transistors are formed in each of the element formation regions. The power transistors are arranged while being aligned along the second direction (x-direction) orthogonal to the first direction.

Each of the power transistors has the gate electrode GE. The gate electrodes GE are configured using the wiring layer M1 of the first layer, and extend parallel to each other in the first direction. The wiring layer M1 of the first layer is made of metal mainly containing, for example, Al (aluminum) and the like.

The gate connection line GBL1 is arranged near the source bus line SBL in planar view. The gate connection line GBL1 extends in the second direction in the transistor units TU, and one ends (on the source bus line SBL side) of the gate electrodes GE are coupled to the gate connection line GBL1. In other words, the gate electrodes GE are coupled parallel to each other through the gate connection line GBL1. For example, as shown in FIG. 1, the gate connection lines GBL1 extend from one ends of the transistor units TU to the other ends thereof in the second direction, and are coupled to all the gate electrodes GE provided in the power transistors formed in the element formation regions of the transistor units TU.

The gate electrodes GE and the gate connection line GBL1 are integrally formed, and the gate connection line GBL1 is configured using the wiring layer M1 of the first layer. The width of the gate connection line GBL1 in the first direction is, for example, 8 to 10 μm. The width of the gate connection line GBL1 in the first direction is increased, the area of the semiconductor device is increased. Thus, the width of the gate connection line GBL1 in the first direction cannot be increased.

The power transistors have the source electrodes SE and the drain electrodes DE that are alternately provided in the second direction. The source electrodes SE and the drain electrodes DE are configured using the wiring layer M2 of the second layer that is formed on the layer above the wiring layer M1 of the first layer through a first interlayer insulating film, and extend parallel to each other in the first direction. The wiring layer M2 of the second layer is made of metal mainly containing, for example, Al (aluminum) and the like.

The source electrodes SE are coupled to the substrate SB through a plurality of openings OS for source electrodes formed in the first interlayer insulating film. Further, the drain electrodes DE are coupled to the substrate SB through a plurality of openings OD for drain electrodes formed in the first interlayer insulating film. In addition, the gate electrodes GE are provided between the openings OS for source electrodes and the openings OD for drain electrodes.

In other words, the opening OS for a source electrode through which the source electrode SE is coupled to the substrate SB, the gate electrode GE, the opening OD for a drain electrode through which the drain electrode DE is coupled to the substrate SB, and the gate electrode GE are repeatedly arranged in order along the second direction in the element formation region. The source electrode SE is formed on the layer above the gate electrodes GE located on the both sides of each of the openings OS for source electrodes in the second direction through the first interlayer insulating film.

Further, the source electrodes SE are coupled parallel to each other through the source bus line SBL, and the source electrodes SE and the source bus line SBL are integrally formed. Further, the drain electrodes DE are coupled parallel to each other through the drain bus line DBL, and the drain electrodes DE and the drain bus line DBL are integrally formed. Thus, the source bus line SBL and the drain bus line DBL are configured using the wiring layer M2 of the second layer.

Further, the gate bus line GBL2 is provided above the gate connection line GBL1. The gate bus line GBL2 is configured using the wiring layer M3 of the third layer that is formed on the layer above the wiring layer M2 of the second layer through a second interlayer insulating film. The wiring layer M3 of the third layer is made of metal mainly containing, for example, Al (aluminum), Cu (copper), or the like.

Since the gate bus line GBL2 is configured using the wiring layer M3 of the third layer, the gate bus line GBL2 can be formed while being overlapped with the element formation regions. Accordingly, the width of the gate bus line GBL2 in the first direction can be made larger than that of the gate connection line GBL1 in the first direction. Thus, the parasitic resistance and the parasitic inductance of the gate connection line GBL1 can be reduced by the gate bus line GBL2. The width of the gate bus line GBL2 in the first direction is, for example, one tenth of that of the element formation region in the first direction, and a value of about 40 to 100 μm can be exemplified as a representative value.

Further, the gate bus line GBL2 is formed over the substrate SB through the first and second interlayer insulating films. Thus, the distance between the gate bus line GBL2 and the substrate SB is increased, and the parasitic capacitance therebetween becomes small. Accordingly, effects by the gate delay can be suppressed.

The gate connection line GBL1 and the gate bus line GBL2 are coupled to each other through the connection holes CN formed in the first and second interlayer insulating films formed therebetween. However, the source electrode SE configured using the wiring layer M2 of the second layer is provided between the gate connection line GBL1 and the gate bus line GBL2. Accordingly, an opening OP is provided at a part of the source electrode SE located between the gate connection line GBL1 and the gate bus line GBL2, and the connection hole CN is formed inside the opening OP. The length of one side of the connection hole CN is, for example, about 6 μm, and the length of one side of the opening OP is, for example, about 12 μm.

The connection hole CN is formed inside the opening OP formed in the source electrode SE, and the gate connection line GBL1 and the gate bus line GBL2 are electrically coupled to each other through the connection hole CN. Thus, the gate potential is advantageously stabilized.

As described above, the gate bus line GBL2 that is configured using the wiring layer M3 of the third layer and is electrically coupled to the gate connection line GBL1 is provided on the layer above the gate connection line GBL1 that is configured using the wiring layer M1 of the first layer and bundles the gate electrodes GE in the embodiment. In the case where the width of the gate connection line GBL1 in the first direction is widened to reduce the resistance, the area of the semiconductor device is disadvantageously increased. On the contrary, since the gate bus line GBL2 is configured using the wiring layer M3 of the third layer, the gate bus line GBL2 can be formed so as to cover the transistor units TU. Thus, the width of the gate bus line GBL2 in the first direction can be widened without increasing the area of the semiconductor device. Accordingly, the resistance of the gate bus line GBL2 can be reduced and the switching delay time of the semiconductor device can be shortened without increasing the area of the semiconductor device.

First Modified Example

Figure 5:
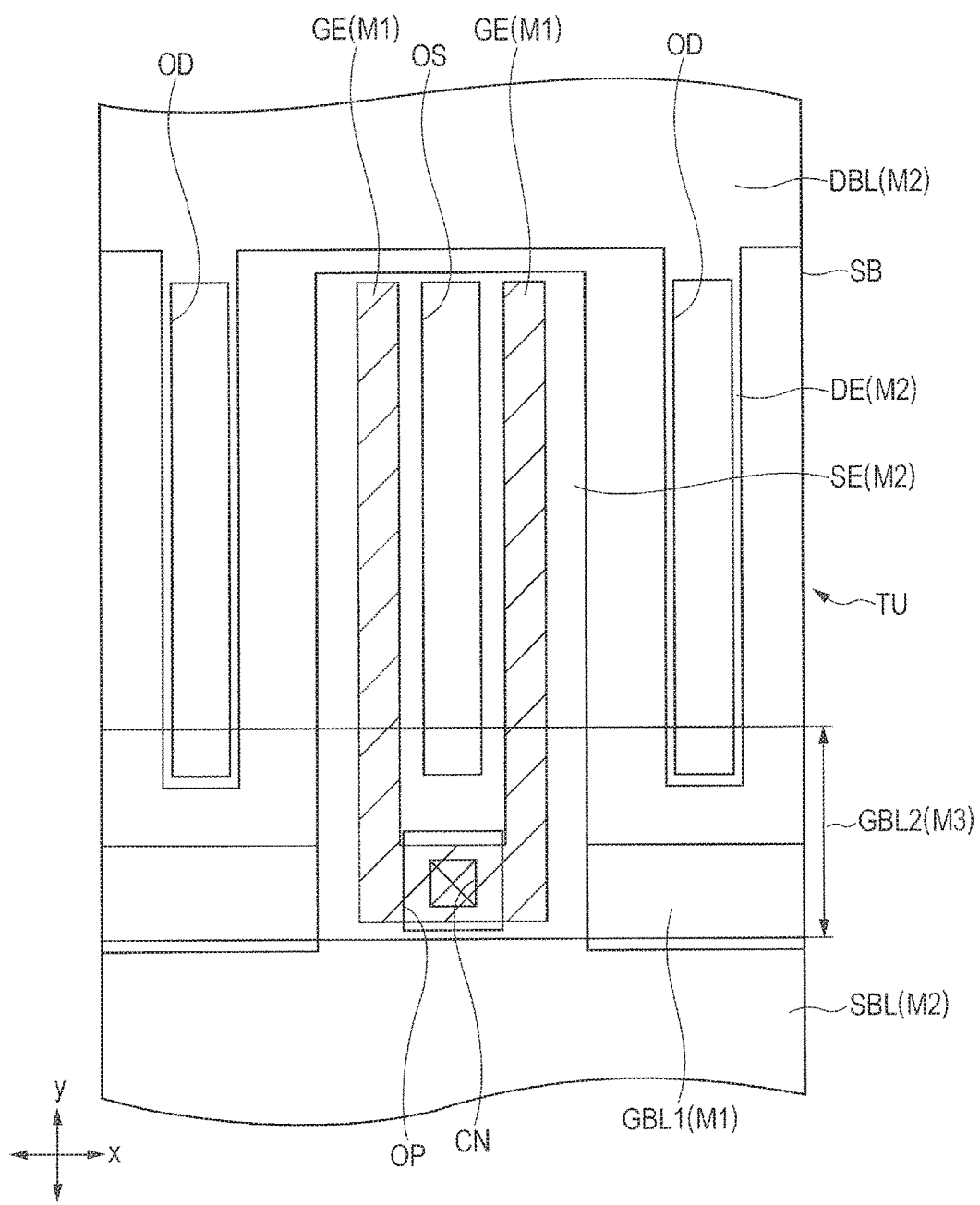
FIG. 5 is a plan view for showing a first modified example of a configuration of each power transistor provided in the transistor units according to the embodiment.

A first modified example of a layout of the gate bus lines provided in the semiconductor device according to the embodiment will be described using FIG. 5. FIG. 5 is a plan view for showing the first modified example of a configuration of each power transistor provided in the transistor units according to the embodiment.

In the configuration of each power transistor shown in FIG. 4, the gate connection line GBL1 extends in the second direction in the transistor units TU, and is coupled to all the gate electrodes GE provided in the power transistors formed in the element formation regions of the transistor units TU.

On the contrary, in the first modified example of the configuration of each power transistor shown in FIG. 5, the gate connection line GBL1 does not extend in the second direction in the transistor units TU but is formed to couple the gate electrodes GE located on the both sides of each of the openings OS for source electrodes in the second direction. In addition, the gate connection lines GBL1 and the gate bus line GBL2 are electrically coupled to each other through the connection holes CN formed in the interlayer insulating film between the gate connection lines GBL1 and the gate bus line GBL2.

Accordingly, the gate connection line GBL1 is not located near the drain electrodes DE, and the drain voltage has no influence on the gate connection line GBL1 even if, for example, a drain voltage of about 100 V is applied to the drain electrodes DE.

Second Modified Example

Figure 6:
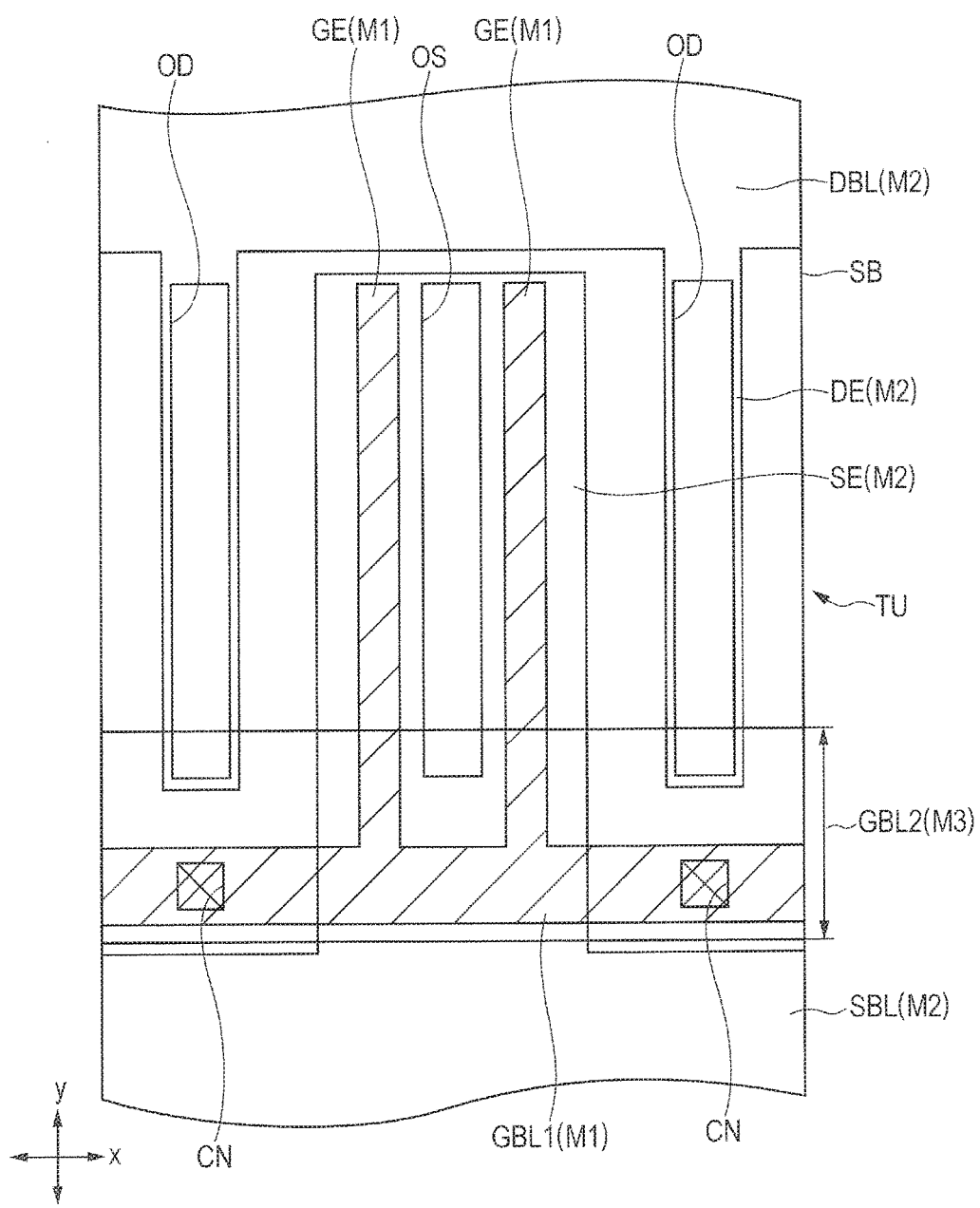
FIG. 6 is a plan view for showing a second modified example of a configuration of each power transistor provided in the transistor units according to the embodiment.

A second modified example of a layout of the gate bus lines provided in the semiconductor device according to the embodiment will be described using FIG. 6. FIG. 6 is a plan view for showing the second modified example of a configuration of each power transistor provided in the transistor units according to the embodiment.

In the configuration of each power transistor shown in FIG. 4, the connection hole CN coupling the gate connection line GBL1 to the gate bus line GBL2 is formed in the region where the source electrode SE is provided.

On the contrary, in the second modified example of the configuration of each power transistor shown in FIG. 6, the connection hole CN coupling the gate connection line GBL1 to the gate bus line GBL2 is formed in the region where the source electrode SE is not provided.

Accordingly, when the connection hole CN is formed inside the opening OP formed in the source electrode SE, it is not necessary to consider the misalignment of the connection hole CN and the opening OP. Further, it is possible to avoid unnecessary conduction between the source electrodes SE and the gate electrodes GE.

Third Modified Example

Figure 7:
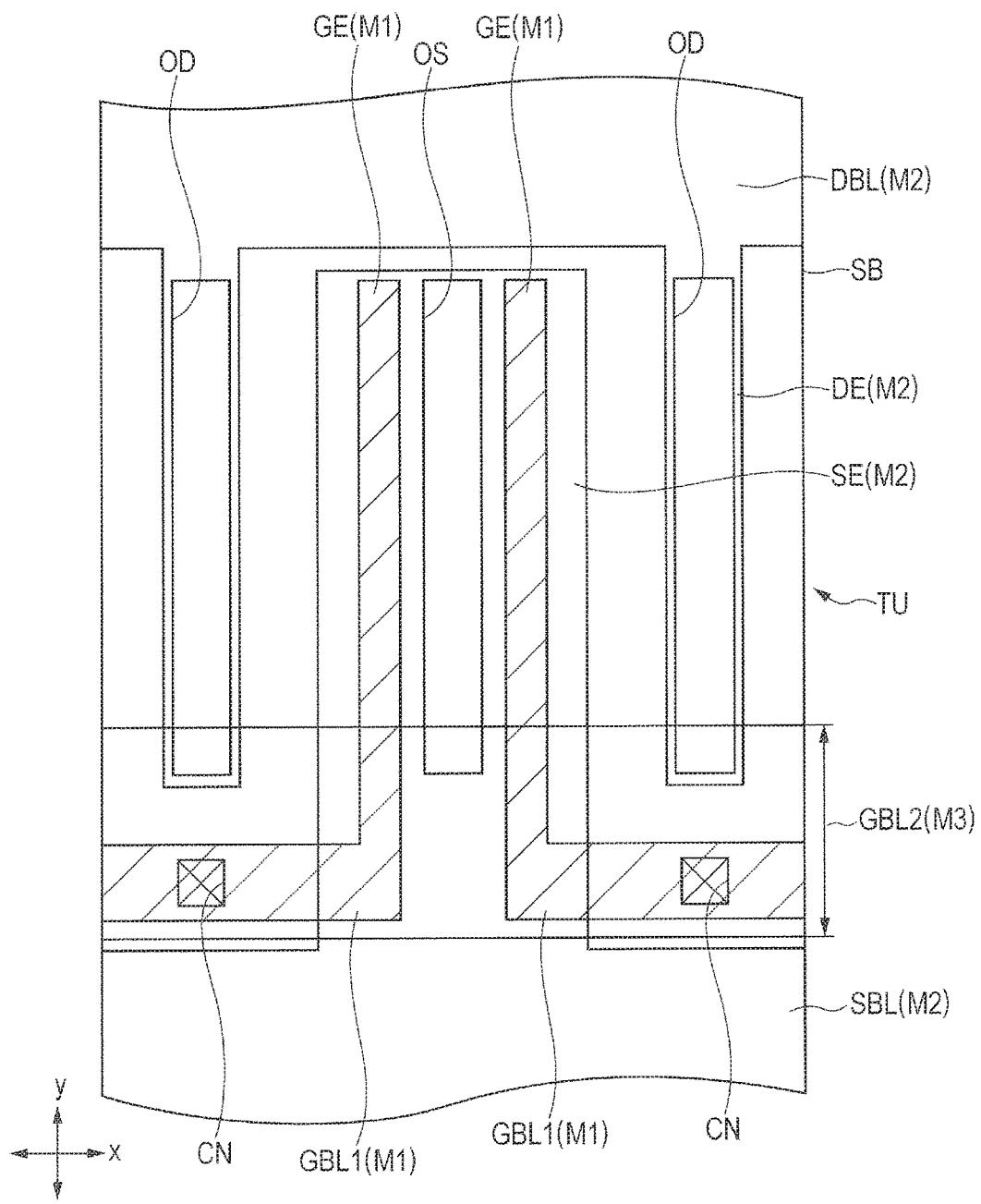
FIG. 7 is a plan view for showing a third modified example of a configuration of each power transistor provided in the transistor units according to the embodiment.

A third modified example of a layout of the gate bus lines provided in the semiconductor device according to the embodiment will be described using FIG. 7. FIG. 7 is a plan view for showing the third modified example of a configuration of each power transistor provided in the transistor units according to the embodiment.

In the configuration of each power transistor shown in FIG. 4, the gate connection line GBL1 extends in the second direction in the transistor units TU, and is coupled to all the gate electrodes GE provided in the power transistors formed in the element formation regions of the transistor units TU.

On the contrary, in the third modified example of the configuration of each power transistor shown in FIG. 7, the gate connection line GBL1 does not extend in the second direction in the transistor units TU but is formed to couple the gate electrodes GE located on the both sides of each of the openings OD for drain electrodes in the second direction. In addition, the gate connection lines GBL1 and the gate bus line GBL2 are electrically coupled to each other through the connection holes CN formed at the region where the source electrode SE is not formed between the gate connection lines GBL1 and the gate bus line GBL2.

Accordingly, when the connection hole CN is formed inside the opening OP formed in the source electrode SE, it is not necessary to consider the misalignment of the connection hole CN and the opening OP. Further, it is possible to avoid unnecessary conduction between the source electrodes SE and the gate electrodes GE.

<Device Structure of Semiconductor Device>

Figure 8:
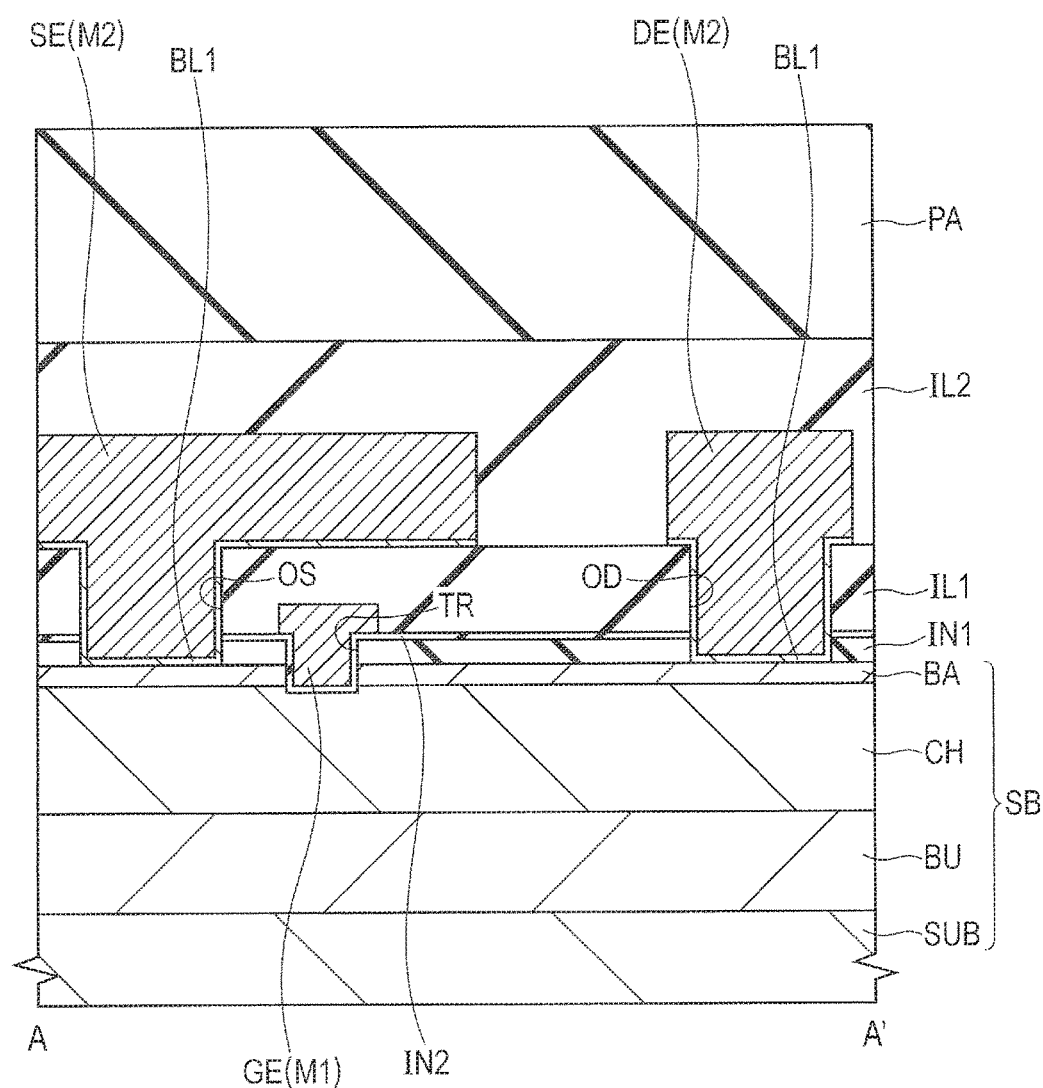
FIG. 8 is a cross-sectional view for showing the power transistor taken along the line A-A' of FIG. 4 according to the embodiment.
Figure 9:
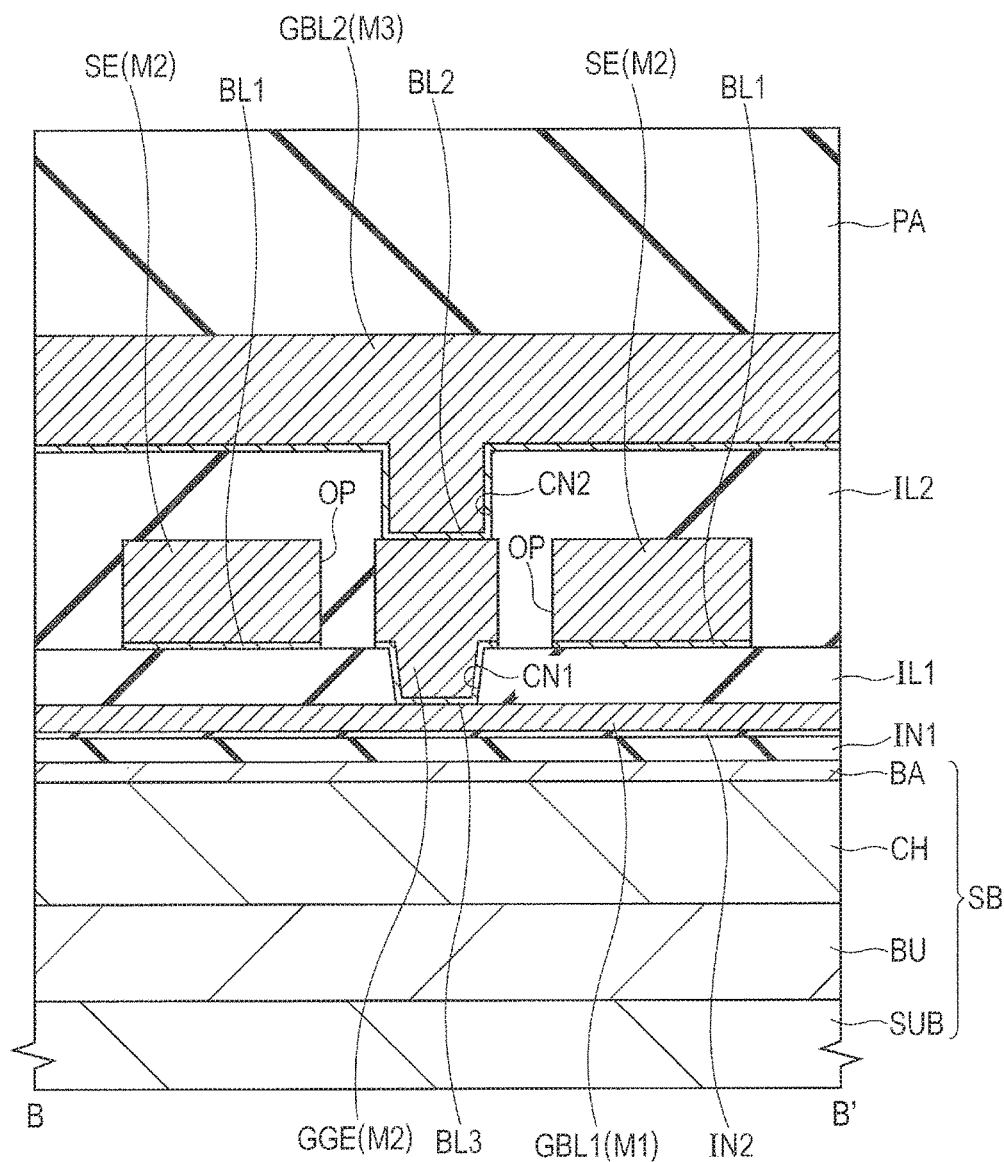
FIG. 9 is a cross-sectional view for showing the power transistor taken along the line B-B' of FIG. 4 according to the embodiment.

A device structure of the semiconductor device according to the embodiment will be described using FIG. 8 and FIG. 9. FIG. 8 is a cross-sectional view for showing the power transistor taken along the line A-A' of FIG. 4 according to the embodiment. FIG. 9 is a cross-sectional view for showing the power transistor taken along the line B-B' of FIG. 4 according to the embodiment. In the embodiment, a normally-off type power transistor will be described.

As shown in FIG. 8 and FIG. 9, the substrate SB is configured in such a manner that a buffer layer BU, a channel layer CH, and a barrier layer BA are formed over a semiconductor substrate SUB in order by epitaxial growth.

The semiconductor substrate SUB is made of, for example, Si (silicon).

The buffer layer BU is formed to moderate the lattice constant mismatch between a material configuring the semiconductor substrate SUB and a material configuring the channel layer CH. The buffer layer BU is a compound semiconductor layer, for example, a nitride semiconductor layer obtained by repeatedly laminating AlN/GaN (aluminum nitride/gallium nitride).

The channel layer CH is made of, for example, GaN (gallium nitride), but may be a different nitride semiconductor layer made of AlGaN (aluminum gallium nitride).

The barrier layer BA is formed using a material that is different in the configuration constant from the channel layer CH. The barrier layer BA is made of, for example, AlGaN (aluminum gallium nitride). A two-dimensional electronic gas serving as a carrier is generated in the channel layer CH by forming the barrier layer BA.

The thickness of the semiconductor substrate SUB is, for example, 600 to 1,000 μm, the thickness of the buffer layer BU is, for example, about 2 μm, the thickness of the channel layer CH is, for example, about 2 μm, and the thickness of the barrier layer BA is, for example, about 10 to 20 nm.

It should be noted that an example of using Si (silicon) for the semiconductor substrate SUB will be described in the embodiment. However, the embodiment is not limited to this, but a substrate made of SiC (silicon carbide) $Al_2O_3$ (sapphire), GaN (gallium nitride) C (diamond), or the like may be used.

An insulating film IN1 is formed over the barrier layer BA. The insulating film IN1 is made of, for example, SiN (silicon nitride), and the thickness thereof is, for example, about 300 nm.

A trench TR is formed from, the surface of the insulating film IN1 to reach the channel layer CH by penetrating the insulating film IN1 and the barrier layer BA. Namely, the trench TR reaches the channel layer CH across the interface between the barrier layer BA and the channel layer CH. An insulating film IN2 is formed over the surface of the insulating film IN1 including the inner walls (the side surfaces and the bottom surface) of the trench TR, and the gate electrode GE configured using the wiring layer M1 of the first layer is formed over the insulating film IN2 including the inside of the trench TR through the insulating film IN2. The insulating film IN2 functions as a gate insulating film. Further, the gate connection line GBL1 configured using the wiring layer M1 of the first layer is formed integrally with the gate electrode GE.

The insulating film IN2 is made of, for example, $Al_2O_3$ (sapphire) or $SiO_2$ (silicon oxide) in an amorphous state, and the thickness thereof is, for example, about 100 nm. The wiring layer M1 (the gate electrode GE and the gate connection line GBL1) of the first layer is configured using a metal film containing, for example, Al (aluminum), or the like as a main component. The main component in this case is a component that is the highest in content in a member containing a plurality of elements.

In such a structure, the two-dimensional electronic gas formed in the channel layer CH is divided by the gate electrode GE. Therefore, no current flows in the channel layer CH in a state where no voltage is applied to the gate electrode GE. In addition, when a voltage is applied to the gate electrode GE, a current flows in the channel layer CH.

A first interlayer insulating film IL1 is formed so as to cover the gate electrode GE. The first interlayer insulating film IL1 is made of, for example, $SiO_2$ (silicon oxide), and the thickness thereof is, for example, about 2 µm over the gate electrode GE. The opening OS for a source electrode and the opening OD for a drain electrode that are separated from the gate electrode GE and reach the barrier layer BA by penetrating the first interlayer insulating film IL1 and the insulating films IL1 and IL2 are formed on the both sides of the gate electrode GE.

The source electrode SE configured using the wiring layer M2 of the second layer is formed over the first interlayer insulating film IL1, and is embedded into the inside of the opening OS for a source electrode to be electrically coupled to the barrier layer BA. Further, the source bus line SBL configured using the wiring layer M2 of the second layer is formed integrally with the source electrode SE (see FIG. 4).

The drain electrode DE configured using the wiring layer M2 of the second layer is formed over the first interlayer insulating film IL1, and is embedded into the inside of the opening OD for a drain electrode to be electrically coupled to the barrier layer BA. Further, the drain bus line DEL configured using the wiring layer M2 of the second layer is formed integrally with the drain electrode DE (see FIG. 4).

Further, a plurality of first connection holes CN1 is formed in the first interlayer insulating film IL1 over the gate connection line GBL1. A pad electrode GGE configured using the wiring layer M2 of the second layer is embedded into the inside of each of the first connection holes CN1 to be electrically coupled to the gate connection line GBL1.

The wiring layer M2 of the second layer is configured using a metal film containing, for example, Al (aluminum) as a main component, and a barrier metal layer BL1 is formed under the wiring layer M2 of the second layer. The barrier metal layer BL1 is configured using a laminated film in which, for example, Ti (titanium) is used for a lower layer and TiN (titanium nitride) is used for an upper layer. The thickness of each of the source electrode SE and the drain electrode DE over the first interlayer insulating film IL1 is, for example, about 4 to 5 µm.

A second interlayer insulating film IL2 is formed so as to cover the source electrode SE, the drain electrode DE, and the pad electrode GGE. The second interlayer insulating film IL2 is made of, for example, $SiO_2$ (silicon oxide), and the thickness thereof is, for example, about 2 µm over the source electrode SE and the drain electrode DE. A second connection hole CN2 is formed by penetrating the second interlayer insulating film IL2 to reach the pad electrode GGE.

The gate bus line GBL2 configured using the wiring layer M3 of the third layer is formed over the second interlayer insulating film IL2, and is embedded into the inside of the second connection hole CN2 to be electrically coupled to the pad electrode GGE.

The wiring layer M3 of the third layer is configured using a metal film containing, for example, Al (aluminum) as a main component, and a barrier metal layer BL2 is formed under the wiring layer M3 of the third layer. The barrier metal layer BL2 is configured using a laminated film in which, for example, Ti (titanium) is used for a lower layer and TiN (titanium nitride) is used for an upper layer. The thickness of the gate bus line GBL2 over the second interlayer insulating film IL2 is, for example, about 4 to 5 µm.

A passivation film PA is formed so as to cover the gate bus line GBL2. The passivation film PA is made of, for example, polyimide.

First Modified Example

Figure 10:
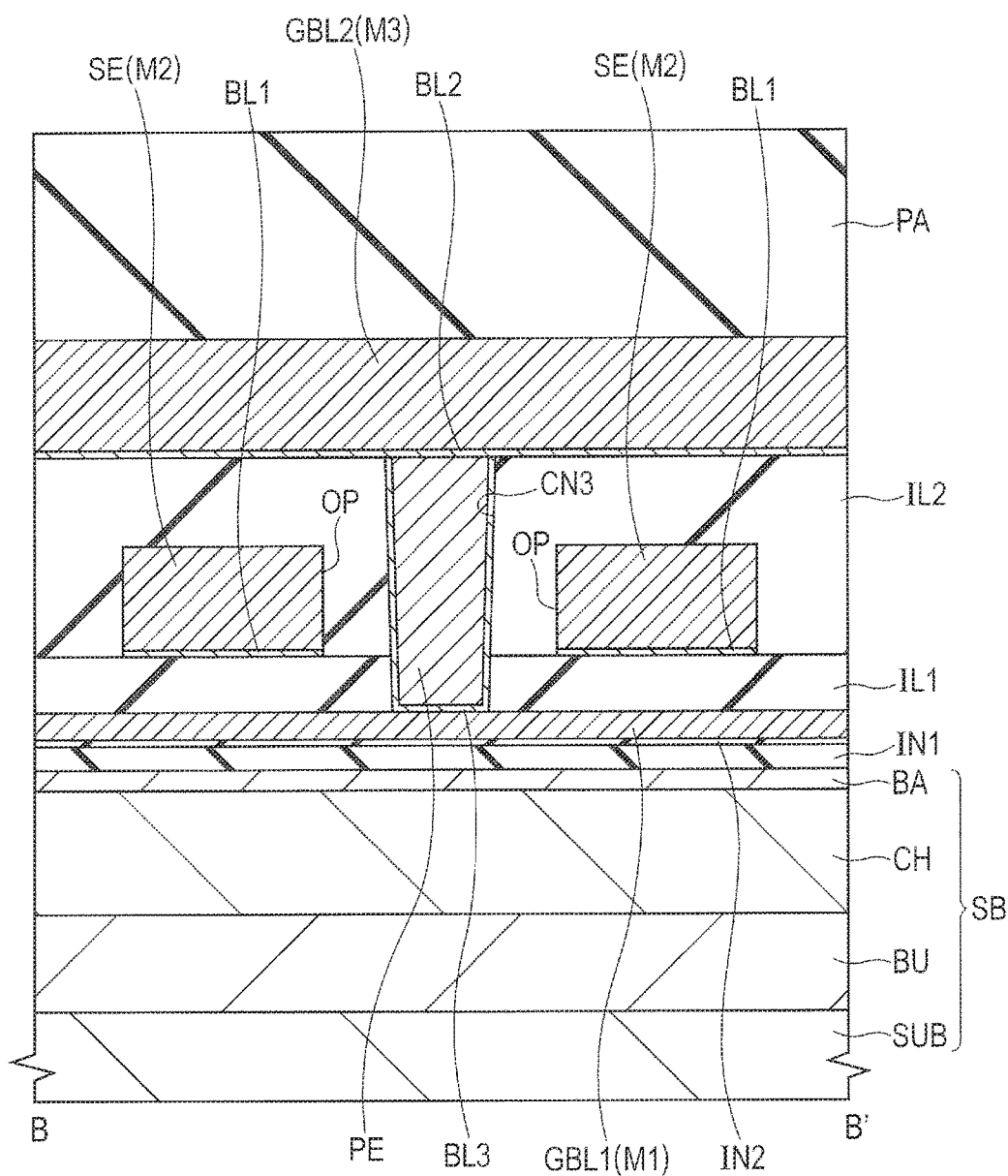
FIG. 10 is a cross-sectional view for showing the first modified example of the power transistor taken along the line B-B' of FIG. 4 according to the embodiment.

A first modified example of the device structure of the semiconductor device according to the embodiment will be described using FIG. 10. FIG. 10 is a cross-sectional view for showing the first modified example of the power transistor taken along the line B-B' of FIG. 4 according to the embodiment.

In the power transistor shown in FIG. 9, the gate connection line GBL1 configured using the wiring layer M1 of the first layer and the gate bus line GBL2 configured using the wiring layer M3 of the third layer are electrically coupled to each other through the pad electrode GGE configured using the wiring layer M2 of the second layer.

On the contrary, in the first modified example of the power transistor shown in FIG. 10, the pad electrode GGE is not formed, but a third connection hole CN3 is formed by penetrating the first interlayer insulating film IL1 and the second interlayer insulating film IL2 to reach the gate connection line GBL1. In addition, a plug electrode PE is embedded into the inside of the third connection hole CN3, and the gate connection line GBL1 and the gate bus line GBL2 are electrically coupled to each other through the plug electrode PE.

The plug electrode PE is configured using a metal film containing, for example, W (tungsten) as a main component, and a barrier metal layer BL3 is formed under (between the plug electrode PE and the inner wall of the third connection hole CN3) the plug electrode PE. The barrier metal layer BL3 is configured using a laminated film in which, for example, Ti (titanium) is used for a lower layer and TiN (titanium nitride) is used for an upper layer.

Since the pad electrode GGE is not formed, the source electrode SE configured using the wiring layer M2 of the second layer can be easily processed.

Second Modified Example

Figure 11:
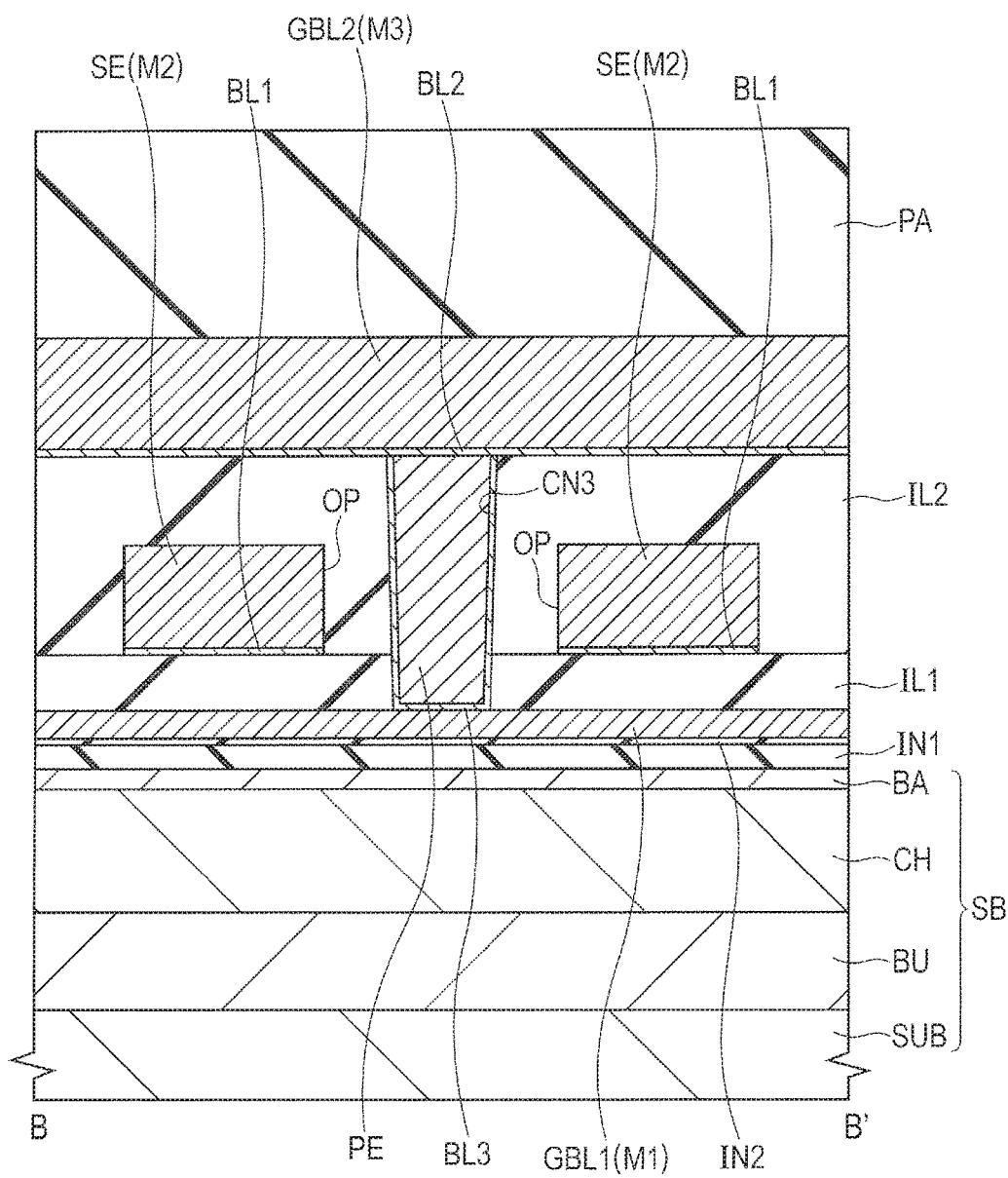
FIG. 11 is a cross-sectional view for showing the second modified example of the power transistor taken along the line B-B' of FIG. 4 according to the embodiment.

A second modified example of the device structure of the semiconductor device according to the embodiment will be described using FIG. 11. FIG. 11 is a cross-sectional view for showing the second modified example of the power transistor taken along the line B-B' of FIG. 4 according to the embodiment.

In the power transistor shown in FIG. 9, the gate bus line GBL2 is configured using a metal film containing Al (aluminum) as a main component.

On the contrary, in the second modified example of the power transistor shown in FIG. 11, the gate bus line GBL2 is configured using a metal film containing Cu (copper) as a main component. Accordingly, the low resistance of the gate bus line GBL2 can be realized.

It should be noted that in the second modified example of the power transistor, the gate connection line GBL1 and the gate bus line GBL2 are electrically coupled to each other through the plug electrode PE as similar to the first modified example of the power transistor shown in FIG. 10. However, the gate connection line GBL1 and the gate bus line GBL2 may be electrically coupled to each other through the pad electrode GGE shown in FIG. 9.

<Switching Operation of Semiconductor Device>

A switching operation of the semiconductor device according to the embodiment will be described using the example of the semiconductor device composed of eight transistor units shown in FIG. 1.

The gate width (finger length) of the power transistor is about 0.5 mm. The gate pitch is about 20 μm, and fifty transistor cells are coupled parallel to each other in the second direction.

The width of the gate electrode GE of the power transistor in the second direction is about 4 μm, and the width of the gate connection line GBL1 in the second direction is about 8 μm. The wiring layer M1 of the first layer configuring the gate electrode GE and the gate connection line GBL1 is configured using a metal film containing Al (aluminum) as a main component, and the thickness thereof is about 0.1 μm.

The width of the source electrode SE of the power transistor in the second direction is about 20 μm, and the width of the drain electrode DE in the first direction is about 4 μm. The wiring layer M2 of the second layer configuring the source electrode SE, the source bus line SBL, the drain electrode DE, and the drain bus line DBL is configured using a metal film containing Al (aluminum) as a main component, and the thickness thereof is about 4 μm.

The width of the gate bus line GBL2 in the first direction is about 40 μm, and the thickness thereof is about 4 μm. The wiring layer M3 of the third layer configuring the gate bus line GBL2 is configured using a metal film containing Al (aluminum) as a main component, and the thickness thereof is about 4 μm.

The entire semiconductor device (semiconductor chip) was sealed with a package, and one end of a wire having a diameter of 200 μm was coupled to each of the gate bus line GBL2 (gate pad), the source bus line SBL (source pad), and the drain bus line DBL (drain pad). In addition, the other end of the wire was coupled to each of the gate terminal, the source terminal, and the drain terminal of the package to measure operation characteristics of the semiconductor device.

As a result of measuring the resistance between the gate and the source of the package in which the semiconductor device according to the embodiment was mounted using an LCR meter, the resistance between the gate and the source was 0.7Ω under the condition where a small modulation voltage with frequency of 1 MHz was applied. On the contrary, as a result of measuring the resistance between the gate and the source of a package in which a semiconductor device according to a comparative example having no gate bus line GBL2 was mounted using an LCR meter, the resistance between the gate and the source was 5.5Ω under the condition where a small modulation voltage with frequency of 1 MHz was applied. Accordingly, it can be understood that the gate resistance can be considerably reduced in the semiconductor device according to the embodiment.

Further, as a result of measuring the switching time by a double pulse method using the package in which the semiconductor device according to the embodiment was mounted, the switching time when being turned on was 5 nanoseconds and the switching time when being turned off was 6 nanoseconds under the conditions of a power source voltage of 400 V, an on-current of 10A, and a gate external resistance of 10Ω. On the contrary, as a result of measuring the switching time by a double pulse method using the package in which the semiconductor device according to the comparative example having no gate bus line GBL2 was mounted, the switching time when being turned on was 8 nanoseconds and the switching time when being turned off was 10 nanoseconds under the same conditions as above. Accordingly, it can be understood that the switching time can be shortened by about 30% in the semiconductor device according to the embodiment. Since the switching loss is approximately proportional to the switching time, the driving loss of the circuit can be considerably reduced in a high-frequency switching operation.

As described above, according to the embodiment, the switching delay time of the semiconductor device can be shortened.

The invention achieved by the inventors has been described above in detail on the basis of the embodiment. However, it is obvious that the present invention is not limited the embodiment, but can be variously changed without departing from the scope thereof.

What is claimed is:
1. A semiconductor device comprising:
a source bus line and a drain bus line that are provided apart from each other over a main surface of a substrate in a first direction in planar view;
a transistor unit that is provided between the source bus line and the drain bus line;
a plurality of gate electrodes that extends in the first direction in the transistor unit and is provided apart from each other in a second direction orthogonal to the first direction in planar view;
a gate bus line that is electrically coupled to the gate electrodes, wherein the gate electrodes are formed in a first wiring layer, wherein the source bus line and the drain bus line are formed in a second wiring layer above the first wiring layer, and wherein the gate bus line is formed in a third wiring layer above the second wiring layer;
a plurality of source electrodes that is formed in the second wiring layer in the transistor unit and is provided apart from each other in the second direction while extending in the first direction;
a plurality of drain electrodes that is formed in the second wiring layer in the transistor unit and is provided apart from each other in the second direction while extending in the first direction; and
a gate connection line that is formed in the first wiring layer and extends in the second direction, wherein
the source electrodes and the drain electrodes are alternately provided in the second direction,
the gate electrode is arranged between a part where the source electrode is coupled to the substrate and a part where the drain electrode is coupled to the substrate,
one ends of the source electrodes in the first direction are coupled by the source bus line,
one ends of the drain electrodes in the first direction are coupled by the drain bus line,
one ends of the gate electrodes in the first direction are coupled by the gate connection line,
the gate bus line is located above the gate connection line,
a part of the source electrode is located between the gate connection line and the gate bus line, and
the gate connection line and the gate bus line are electrically coupled to each other through a connection part penetrating the source electrode.

2. The semiconductor device according to claim 1,
wherein the connection part includes:
   an interlayer insulating film formed between the gate connection line and the gate bus line;
   a connection hole penetrating the interlayer insulating film; and
   a plug electrode embedded into the connection hole.

3. The semiconductor device according to claim 1,
wherein the connection part includes a pad electrode configured using the second wiring layer between the gate connection line and the gate bus line, and
wherein the gate connection line and the gate bus line are electrically coupled to each other through the pad electrode.

4. The semiconductor device according to claim 1,
wherein the gate connection line and the gate bus line are electrically coupled to each other through a connection part provided between the gate connection line and the gate bus line at a region where the source electrodes and the drain electrodes are not formed.

5. The semiconductor device according to claim 4,
wherein the connection part includes:
   an interlayer insulating film formed between the gate connection line and the gate bus line;
   a connection hole penetrating the interlayer insulating film; and
   a plug electrode embedded into the connection hole.

6. The semiconductor device according to claim 4,
wherein the connection part includes a pad electrode configured using the second wiring layer between the gate connection line and the gate bus line, and
wherein the gate connection line and the gate bus line are electrically coupled to each other through the pad electrode.

7. The semiconductor device according to claim 1,
wherein a width of the gate bus line in the first direction is larger than that of the gate connection line in the first direction.

8. The semiconductor device according to claim 1,
wherein one ends of the gate electrodes in the first direction located on both sides of the source electrode in the second direction are coupled by the gate connection line.

9. The semiconductor device according to claim 1,
wherein one ends of the gate electrodes in the first direction located on both sides of the drain electrode in the second direction are coupled by the gate connection line.

10. The semiconductor device according to claim 9,
wherein the gate connection line and the gate bus line are electrically coupled to each other through a connection part provided between the gate connection line and the gate bus line, and
wherein the connection part includes:
   an interlayer insulating film formed between the gate connection line and the gate bus line;
   a connection hole penetrating the interlayer insulating film; and
   a plug electrode embedded into the connection hole.

11. The semiconductor device according to claim 9,
wherein the gate connection line and the gate bus line are electrically coupled to each other through a connection part provided between the gate connection line and the gate bus line,
wherein the connection part includes a pad electrode configured using the second wiring layer between the gate connection line and the gate bus line, and
wherein the gate connection line and the gate bus line are electrically coupled to each other through the pad electrode.

12. The semiconductor device according to claim 1,
wherein the gate bus line is not overlapped with the source bus line and the drain bus line in planar view.

13. The semiconductor device according to claim 1,
wherein the gate bus line is overlapped with a part of the transistor unit in planar view.

14. The semiconductor device according to claim 1,
wherein the gate bus line includes:
   a first part extending in the first direction; and
   a second part extending in the second direction on both sides of the first part, wherein the second part is located above the gate connection line.

15. The semiconductor device according to claim 1,
wherein a first wire bonded to the source bus line, a second wire bonded to the drain bus line, and a third wire bonded to the gate bus line are provided.

* * * * *